United States Patent
Grunzke

(10) Patent No.: US 8,688,955 B2
(45) Date of Patent: Apr. 1, 2014

(54) LINE TERMINATION METHODS AND APPARATUS

(75) Inventor: Terry Grunzke, Boise, ID (US)

(73) Assignee: Micron Technology, Inc., Boise, ID (US)

(*) Notice: Subject to any disclaimer, the term of this patent is extended or adjusted under 35 U.S.C. 154(b) by 342 days.

(21) Appl. No.: 12/856,000

(22) Filed: Aug. 13, 2010

(65) Prior Publication Data
US 2012/0042148 A1  Feb. 16, 2012

(51) Int. Cl.
*G06F 13/18* (2006.01)

(52) U.S. Cl.
USPC ........... 711/211; 710/107; 711/154; 711/170; 711/202

(58) Field of Classification Search
USPC ............... 711/211, 107, 154, 170; 710/107
See application file for complete search history.

(56) References Cited

U.S. PATENT DOCUMENTS

| | | | |
|---|---|---|---|
| 5,798,980 A * | 8/1998 | McClure | 365/233.1 |
| 7,516,281 B2 | 4/2009 | LaBerge | |
| 2001/0003837 A1 * | 6/2001 | Norman et al. | 711/5 |
| 2009/0063789 A1 * | 3/2009 | Greeff et al. | 711/154 |
| 2011/0161553 A1 * | 6/2011 | Saxena et al. | 711/103 |

OTHER PUBLICATIONS

ONFi—Open Nand Flash Interface Specification Revision 2.2 Oct. 7, 2009, pp. cover, ii, 29-30, 32, 48-64, 114-115, http://onfi.org/specifications/.

* cited by examiner

*Primary Examiner* — Jae Yu
(74) *Attorney, Agent, or Firm* — Leffert Jay & Polglaze, P.A.

(57) ABSTRACT

Methods and apparatus for termination of signal lines coupled to a number of memory devices are disclosed. One such method includes adjusting an input impedance of one or more terminals of an interface of a memory device in response to the memory device receiving a particular address. One such apparatus includes memory devices configured to selectively adjust an input impedance seen by one or more of the signal lines in response to receiving a particular address.

31 Claims, 9 Drawing Sheets

LINE TERMINATION METHODS AND APPARATUS

TECHNICAL FIELD

The present disclosure relates generally to signal lines in electronic devices and, in particular, in one or more embodiments, the present disclosure relates to line termination using non-volatile memory devices.

BACKGROUND

Time varying signals in electronic devices are utilized to transfer information (e.g., data) over one or more conductors often referred to as signal lines. These signal lines are often bundled together to form a communications bus, such as an address or data bus, for example. Termination is often used on these busses in order to reduce certain transmission line effects due to various electrical properties of the bus. For example, a mismatch in characteristic impedance of two signal lines coupled together can result in reflections. Capacitive and inductive effects can also cause undesirable issues with signal integrity. Thus, it is typically desirable to reduce these effects in order to reduce the likelihood of data corruption as the data is transmitted on a bus.

Memory devices are an example of devices which often utilize address and data busses. Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged and accessed. Typically, the array of memory cells for NAND flash memory devices is arranged such that memory cells of a string are connected together in series, source to drain.

To meet the demands for higher data read and write transfer rates, designers continue to strive for increasing the access speed of memory devices and systems. Memory systems often are comprised of multiple memory device packages (e.g., die) which are coupled together on a common circuit board and communicate on a common data bus, for example. However, one issue with increased data transfer rates is maintaining signal integrity during these bursts of data on the various bus signal lines of the memory system. As these transfer rates increase, the impedance characteristics of a data bus become more pronounced. Capacitive and inductive characteristics of the circuit board may begin to distort the signal waveforms on the data bus at these higher data rates. Waveforms may begin to spread out and/or reflections may occur at locations of unmatched impedance on the data bus signals, for example.

For the reasons stated above, and for other reasons stated below which will become apparent to those skilled in the art upon reading and understanding the present specification, there is a need in the art for alternative termination methods and apparatus in various memory device architectures.

DETAILED DESCRIPTION

Figure 1:
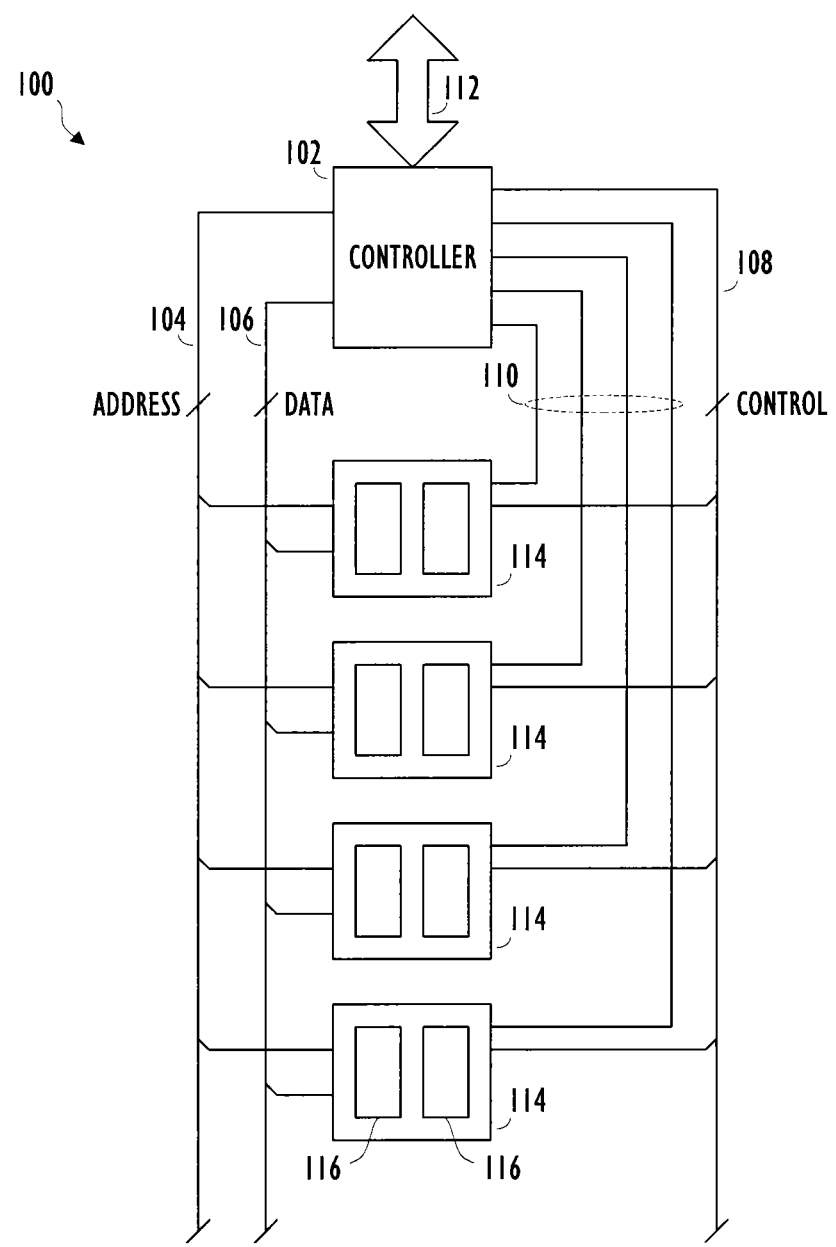
FIG. 1 shows a functional block diagram of a typical memory system.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense.

One method used to improve signal integrity in high data rate applications is to use what is referred to as On-Die Termination (ODT). ODT may be utilized by configuring each of the data nodes (e.g., data outputs) of a particular memory device (e.g., die or package) coupled to the system data bus to act (e.g., function) as a termination device for each line (e.g., signal line) of the data bus. For example, for a particular die to act as a termination device (e.g., a terminating memory device), a pull-up and pull-down resistor configured as a voltage divider might be coupled to each data node of the termination device. Thus, the data nodes of the termination device act as bus terminators for the data bus for which they are coupled.

One particular issue with current ODT methods is that a memory device is selected to act as a termination device by utilizing discrete control signals to direct each memory device when to act as a termination device. Or, a combination of control signals are utilized to indicate a termination mode command. Both of these methods require additional logic to configure these control signals and/or additional signal lines to be added to a memory system which consume real estate on a circuit board and may cause additional undesirable effects, such as noise issues, for example. In contrast to current ODT methods, various embodiments of the present disclosure facilitate selection of a termination device wherein the termination device is responsive to receiving a particular address, for example.

A typical memory system 100 is shown in FIG. 1. The memory system 100 of FIG. 1 might be mounted on a single circuit board (not shown), for example. Coupling to the memory system 100 can be achieved by way of an interface 112. The interface 112 might comprise a plurality of conductive pads (e.g., edge connector) formed on the circuit board. The interface 112 might also be one of a mechanical type of multi-conductor connectors as are known to those skilled in the art, for example. The interface 112 allows for the memory system 100 to be coupled to another electronic system (not shown). The memory system 100 might be coupled through interface 112 to a personal computer (PC), digital camera, or electronic test equipment, for example.

Memory system 100 further comprises a controller 102 which regulates various operations within the memory system 100 as well as providing interactivity with a system coupled to the interface 112, for example. In addition to the controller 102, memory system 100 further comprises one or more memory devices 114. Each memory device 114 might be further comprised of additional memory packages 116 (e.g., die). Each memory device 114 is coupled to the controller 102 by a common address bus 104. The address bus 104 might comprise twelve bus signal lines, for example. Memory devices 114 are also coupled to the controller 102 by a common data bus 106. The data bus 106 might comprise sixteen (e.g., D0-D15) bus signal lines, for example.

Each of the memory devices 114 are also coupled to the controller 102 through one or more common control signals 108. Control signals 108 might comprise signals which are commonly applied to each memory device 114. For example, control signals 108 might comprise clock and/or other synchronization control signals known to those skilled in the art. Memory devices 114 may also be coupled to the controller 102 through additional memory device specific discrete control signals 110. The control signals 110 provide one or more control signals to only a specific memory device 114, such as a chip select (CS) signal, for example. Typical memory devices/systems utilizing ODT, such as discussed above, might also have additional discrete control signals 110 to indicate when a particular memory device 114 is to act as the termination device in the memory system 100, for example.

Figure 2:
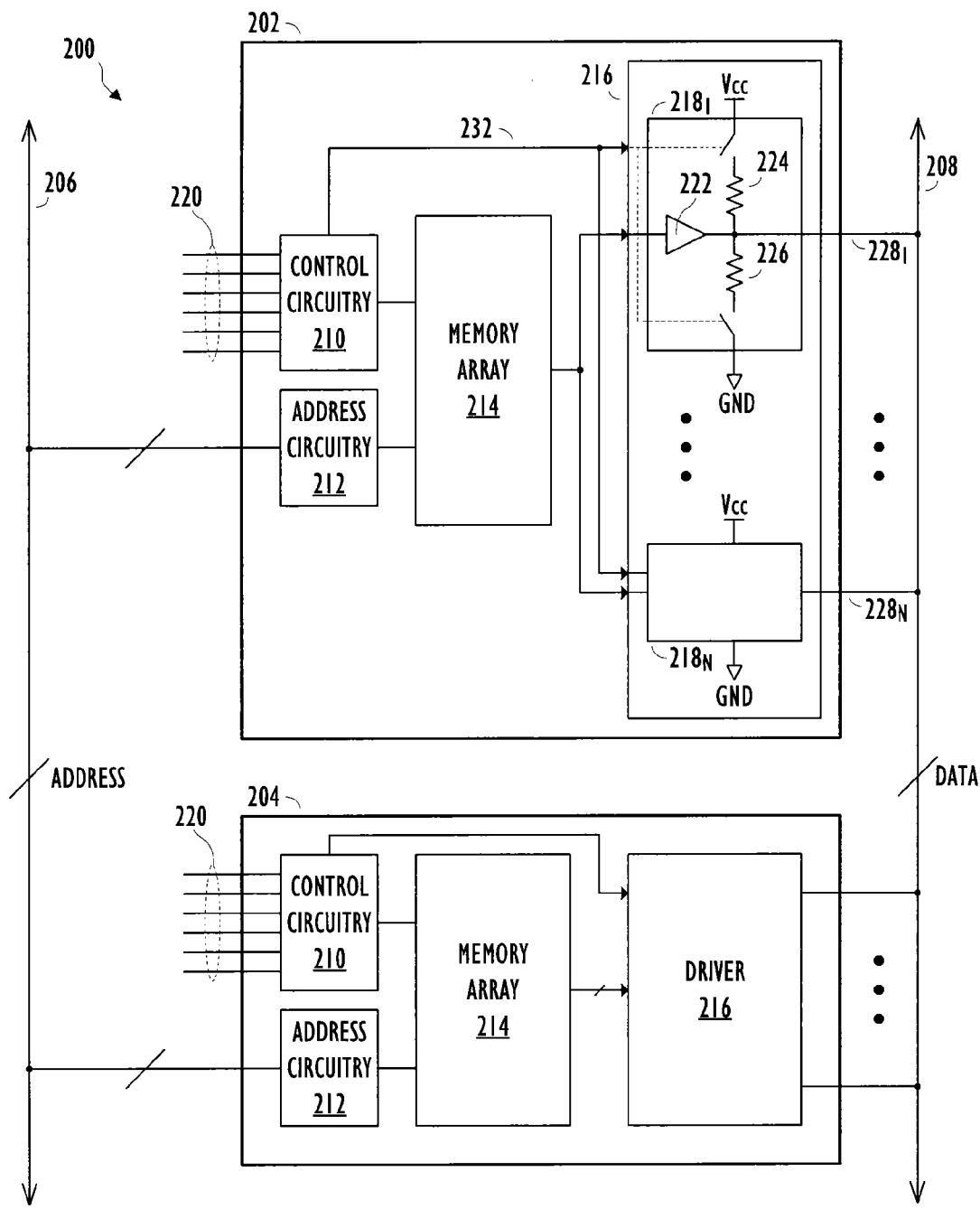
FIG. 2 shows a functional block diagram of a typical memory system utilizing On-Die Termination (ODT.)

A typical memory system 200 similar to memory system 100 and comprising memory devices 202, 204 configured to utilize ODT can be described by way of reference to FIG. 2. The memory system 200 of FIG. 2 comprises a controller (not shown) such as controller 102 discussed with respect to FIG. 1, for example. The memory system 200 of FIG. 2 shows a more detailed illustration of memory devices 202, 204, such as memory devices 114 shown in FIG. 1. Each memory device 202, 204 is coupled to the controller by an address bus 206, data bus 208 and a plurality of control signals 220. Control signals 220 shown coupled to each memory device 202, 204 might comprise both commonly coupled and memory device specific control signals, for example.

Memory device 202 further illustrates a more detailed view of the elements of a typical memory device configured for ODT operation in response to control signals 220. Memory device 202 comprises address circuitry 212 which is coupled to the address bus 206 in order to receive addressing information from the controller in order to access the memory array 214 of the device. Memory device 202 further comprises control circuitry 210 which is coupled to control signals 220 and is configured to manage operations within the memory device 202, such as read and write operations to be performed on the memory array 214, for example. Control circuitry 210 is also configured to manage operations within the output driver 216 of the memory device. These operations might include placing the individual output drivers 218, and thus the data nodes $228_{1-N}$, in a high impedance, driving or termination mode, for example. The output drivers 218 might be placed in a high impedance mode when the memory device is not selected for a particular memory device operation so as to prevent any bus contention on the data bus 208. The output drivers 218 might be placed in a driving mode by enabling a driver 222 when the memory device 202 is selected to drive the data bus to a particular state, such as in response to a read operation from the memory device, for example.

Memory device 202 might also be placed in a termination mode. In termination mode, the individual output drivers $218_{1-N}$ couple (e.g., switch in) a pull-up 224 and a pull-down 226 resistance to each data node $228_{1-N}$ of the termination device, such as is shown in detail in output driver $218_1$, for example. These resistances 224, 226 are switched in and out responsive to a signal 232 provided by control circuitry 210. The pull-up and pull-down resistances are decoupled (e.g., switched out) from the data nodes $228_{1-N}$ when the output drivers $218_{1-N}$ N of the memory device 202 are in the high impedance and/or the driving modes, for example.

Figure 3:
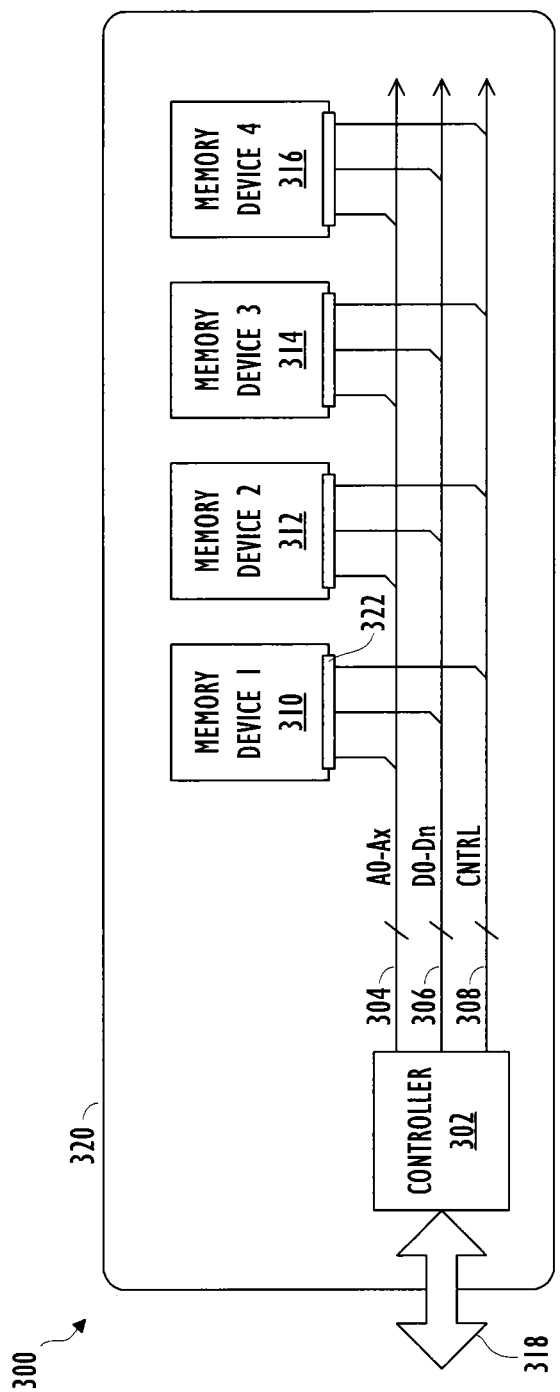
FIG. 3 shows a functional block diagram of a memory system according to an embodiment of the present disclosure.

FIG. 3 illustrates a memory system 300 according to various embodiments of the present disclosure. The memory system 300 illustrated in FIG. 3 comprises a controller 302 and four memory devices 310-316 configured (e.g., physically arranged and mounted) on a printed circuit board (PCB) 320, for example. The components of the memory system, such as controller 302 and/or memory devices 310-316, might be mounted on one or both sides of the PCB 320. The PCB 320 might be a single or a multiple layer PCB, for example.

Memory system 300 further comprises an interface 318, such as an electromechanical connector or other type of connector (e.g., edge connector), which allows the memory system 300 to be coupled to a host or other system (not shown). Memory system 300 also comprises an address bus (A0-Ax) 304, data bus (D0-Dn) 306 and one or more control signals (CNTRL) 308. Individual control signals of 308 are not shown to improve readability of the figure. Control signals 308 might comprise control signals such as Address Latch Enable (ALE), Command Latch Enable (CLE), data strobe (DQS) and a clock signal (CLK), for example. Other control signals are known to those skilled in the art. The address bus 304, data bus 306 and control signals 308 are all shown independent of each other in FIG. 3. However, the address 304 bus, data bus 306, and control signals 308 may all be combined or may be combined in part according to various embodiments of the present disclosure. The address bus and the data bus might comprise the same physical bus according to one or more embodiments of the present disclosure, for example.

Memory devices 310-316 each comprise an interface 322. For example, the interface 322 of each memory device 310-316 might comprise a number of data nodes, such as terminals providing a coupling location with the signal lines 304, 306, 308 of the memory system 300. The terminals might comprise an electromechanical type connection. The terminals of the interface 322 might also comprise a soldered lead connection to the signal lines of the memory system, for example. Thus, a memory device 310-316 configured to operate as a termination device according to various embodiments of the present disclosure facilitates adjustment of the input impedance at one or more of the terminals of its interface 322, for example. By adjusting the input impedance characteristic seen by a signal line coupled to a particular terminal of an interface 322, signal line termination can be facilitated for the particular signal line which is coupled to the terminal, for example.

Memory devices 310-316 might also be comprised of one or more memory packages (e.g., die) (not shown), for example. Although four memory devices are shown in FIG. 3, various embodiments of the present disclosure are not so limited. The memory system 300 might comprise one or more memory devices according to various embodiments of the present disclosure, for example.

One or more of the memory devices 310-316 of FIG. 3 are configured to operate as termination devices according to various embodiments of the present disclosure. For example, Memory Device 1 310 might have been previously selected (e.g., appointed) to act as a termination device for Memory Device 4 316. Thus, a selected (e.g., target) address comprising an address corresponding to Memory Device 4 316 (e.g., a physical address in Memory Device 4) will be stored in Memory Device 1 310. The target address might be stored in a non-volatile portion of Memory Device 1 310 where it is loaded into a particular register as part of an initialization operation, such as following a RESET and/or power up operation, for example. According to one or more embodiments, the target address might be appointed by a controller external to Memory Device 1 310 and the target address is loaded into the memory device register as part of an initialization operation. Following initialization, Memory Device 1 310 monitors one or more signal lines of the address bus 304. Memory Device 4 316 might then be targeted for a memory device operation to be performed, such as a read or write operation, for example.

An address corresponding to Memory Device 4 316 is then transmitted over the address bus 304 to access Memory Device 4 316 in order to perform the intended memory device operation. The address transmitted over the address bus 304 will be received by both Memory Device 1 310 and Memory device 4 316 as they are both commonly coupled to the address bus 304. As Memory Device 1 310 has been appointed to act as a termination device for Memory Device 4 316, Memory Device 1 310 will respond by entering a termination mode, which can include selecting (e.g., activating) termination circuitry (not shown) within Memory Device 1 310.

Although only Memory Device 1 310 has been described as monitoring the address bus 304 and activating its termination circuitry in response to receiving a particular target address, the various embodiments of the present disclosure are not so limited. For example, each memory device 310-316 might monitor the address bus 304. Upon receiving an indication that a memory device operation is to be performed, each memory device 310-316 might compare the address received with the target address stored in each memory device to determine if the memory device is to enter a termination mode during the current memory device operation to be performed. Memory devices not appointed to act as termination devices for the current memory device operation might then return to monitoring the address bus without activating their termination circuitry.

Memory system 300 might be comprised of all memory devices 310-316 configured to act as a termination device according one or more embodiments of the present disclosure. Additional embodiments might comprise a memory system wherein a subset of memory devices are configured to act as termination devices. For example, Memory Device 1 310 and Memory Device 3 314 might be configured to function in a termination mode according to one or more embodiments, wherein Memory Devices 2 312 and Memory Device 4 316 might be memory devices which are not configured for termination mode functionality, for example. According to various embodiments, one or more of the memory devices might be configured to operate in a termination mode at the same time.

In one or more embodiments where each of memory devices 310-316 comprises one or more die, for example, each of the die can be configured to act as a termination device. Additional embodiments might comprise a memory system wherein a subset of the die of each memory device 310-316 are configured to act as termination devices. In such embodiments, for example, if a target address corresponds to a first die in Memory Device 1 310, then one or more die in Memory Device 2 312, for example, might be configured to function in a termination mode. Thus, according to one or more embodiments, any number of die in any number of memory devices of the memory system 300 might be configured to function in a termination mode at a particular time, such as during a memory device operation, for example. It should be noted that a particular die in a particular memory device can act as a termination device for itself and/or another die of the particular memory device according to various embodiments of the present disclosure.

Having two or more die functioning as termination devices in parallel should reduce overall chip capacitance by a factor of the number of die functioning as termination devices and the termination value (e.g., termination resistance) of each of the termination devices, and can lessen the drop on input/output (I/O) power busses. In addition, in embodiments where the only die functioning as termination devices are in just one of Memory Devices 310-316, the termination devices are believed to be electrically close enough to act as a single termination device, which should avoid reflections. Furthermore, according to one or more embodiments, each die of each memory device can be configured with the same or different termination values, or a combination thereof, providing for more flexible options.

Figure 4:
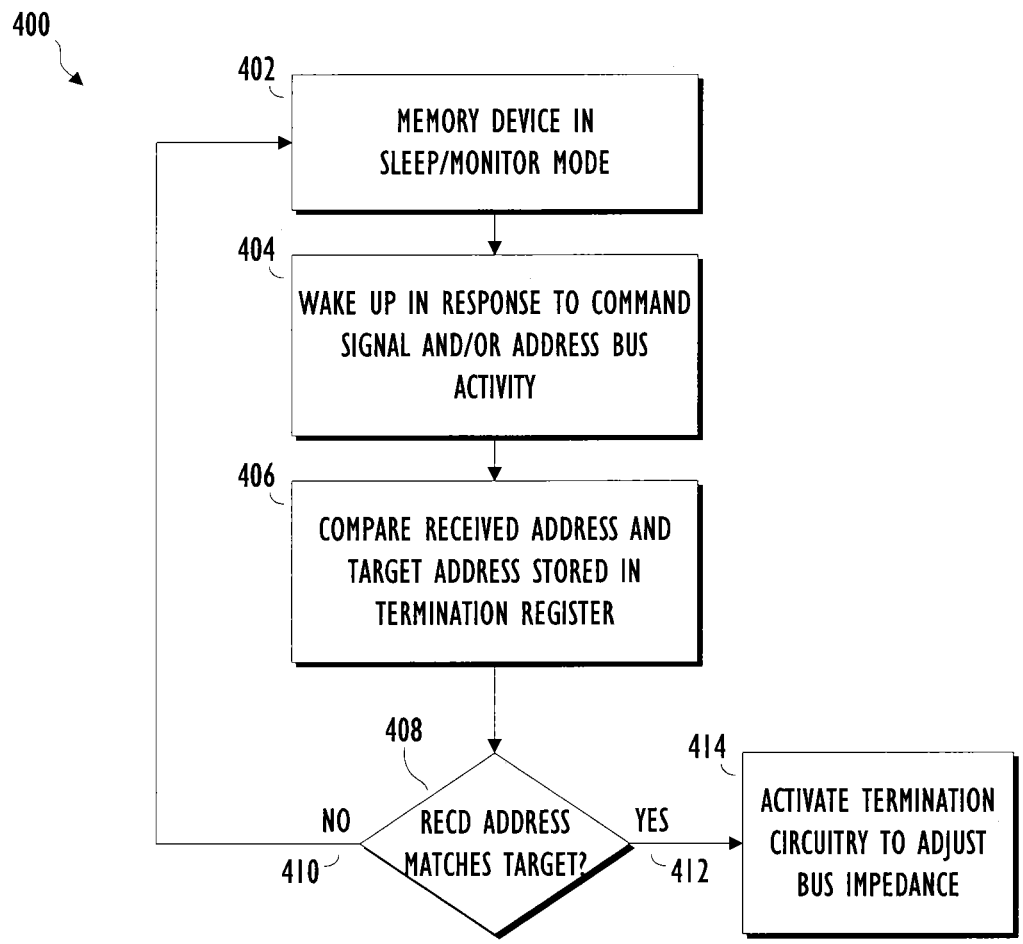
FIG. 4 shows a flowchart of a termination operation according to an embodiment of the present disclosure.

FIG. 4 illustrates a method of operating one or more memory devices 400 in a memory system, such as memory system 300, according to various embodiments of the present disclosure. The one or more memory devices of the memory system may operate in a sleep (e.g., monitor) mode 402, wherein the memory devices wait (e.g., 'snoop') for an indication that a particular memory device operation is to be performed in the memory system. Upon receiving an indication of an memory device operation is to be performed 404, the memory devices "wake up" from sleep mode. Indication of an upcoming memory device operation might be from address bus 304 activity and/or particular activity on the various control signal lines 308 of the memory system 300, for example. Memory devices waiting in a sleep mode facilitate a reduction in power usage by the memory system which is often desirable in many electronic devices, such as battery powered devices, for example.

Upon receiving the address transmitted on the address bus to identify a memory device for the memory device operation, a comparison is made 406 in each memory device. This comparison is made to determine if the received address matches the target address stored in each of the memory devices 408. It should be noted that the comparison 406 may be made in the memory device selected for the memory device operation as a memory device might act as a termination device for itself, according to various embodiments of the present disclosure. If there is no match between the received address and the target address stored in some or all of the memory devices 410, those memory devices will return to the sleep mode 402. However, the memory device selected for the memory device operation may remain awake or may temporarily return to the sleep mode before waking up prior to performing the memory device operation, for example. If a match occurs 412 between the received address and the stored target address in a memory device, that memory device can respond by activating termination circuitry within the memory device 414. Upon completion of the current memory device operation, the memory device may deactivate its termination circuitry and may also return to the sleep mode 402. The memory devices of the memory system may remain in the sleep mode 402 until another indication is detected to indicate that another memory device operation is to be performed in the memory system.

A memory device which has detected that it is to act as a termination device might not activate its termination circuitry until the memory device operation has begun. For example, the termination device might be responsive to further activity on a control signal and/or responsive to activity on the address bus before activating its termination circuitry, for example. A termination device might also wait a specific period of time (e.g., a particular number of clock cycles) before activating its termination circuitry. By delaying the activation of the termination circuitry until the memory device operation has begun, additional power savings might be realized.

Figure 5:
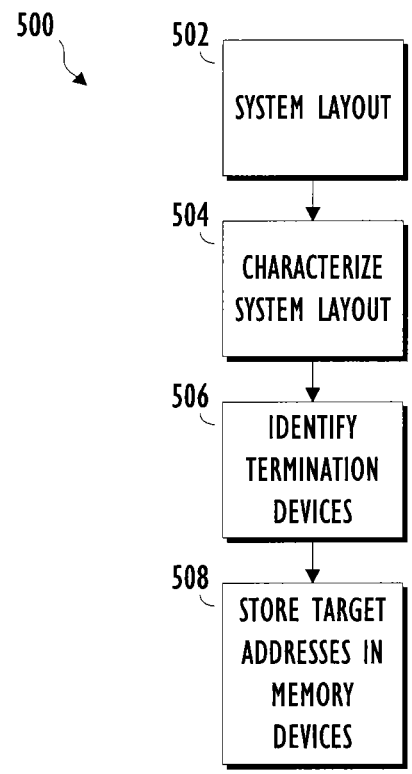
FIG. 5 shows a flowchart of a memory system characterization method according to an embodiment of the present disclosure.

As discussed above, memory devices according to various embodiments of the present disclosure are appointed to act as termination devices during certain memory device operations, for example. A method of appointing memory devices of a memory system to act as termination devices for the system according to various embodiments of the present disclosure is described by way of reference to FIG. 5 and FIG. 3, for example. As discussed above, one or memory devices may be physically arranged on a printed circuit board, for example. The physical layout of the circuit board can affect the characteristic impedances of the signal lines of the memory system. Trace lengths and widths, routing and circuit board materials can each affect the impedances of the signal lines of the memory system, for example. Thus, a system designer might perform an initial physical layout of the memory system 502.

Following the layout operation 502, an analysis of the layout is performed to characterize the impedance characteristics of the various signal lines of the memory system 504. Additional analysis may then be performed to identify which memory devices might act as termination devices during various memory device operations that might be performed during operation of the memory system 506. Target addresses are then stored in the identified memory devices which are to act as termination devices during operation of the memory system 508. By way of example, Memory Device 3 314 of FIG. 3 might be identified 506 to act as a termination device for one or more memory device operations performed on Memory Device 1 310. The address of Memory Device 1 310 (e.g., target address) is then stored 508 in Memory Device 3 314. Thus, Memory Device 3 314 has been appointed as the termination device for Memory Device 1 310 according to one or more embodiments of the present disclosure.

Figure 6:
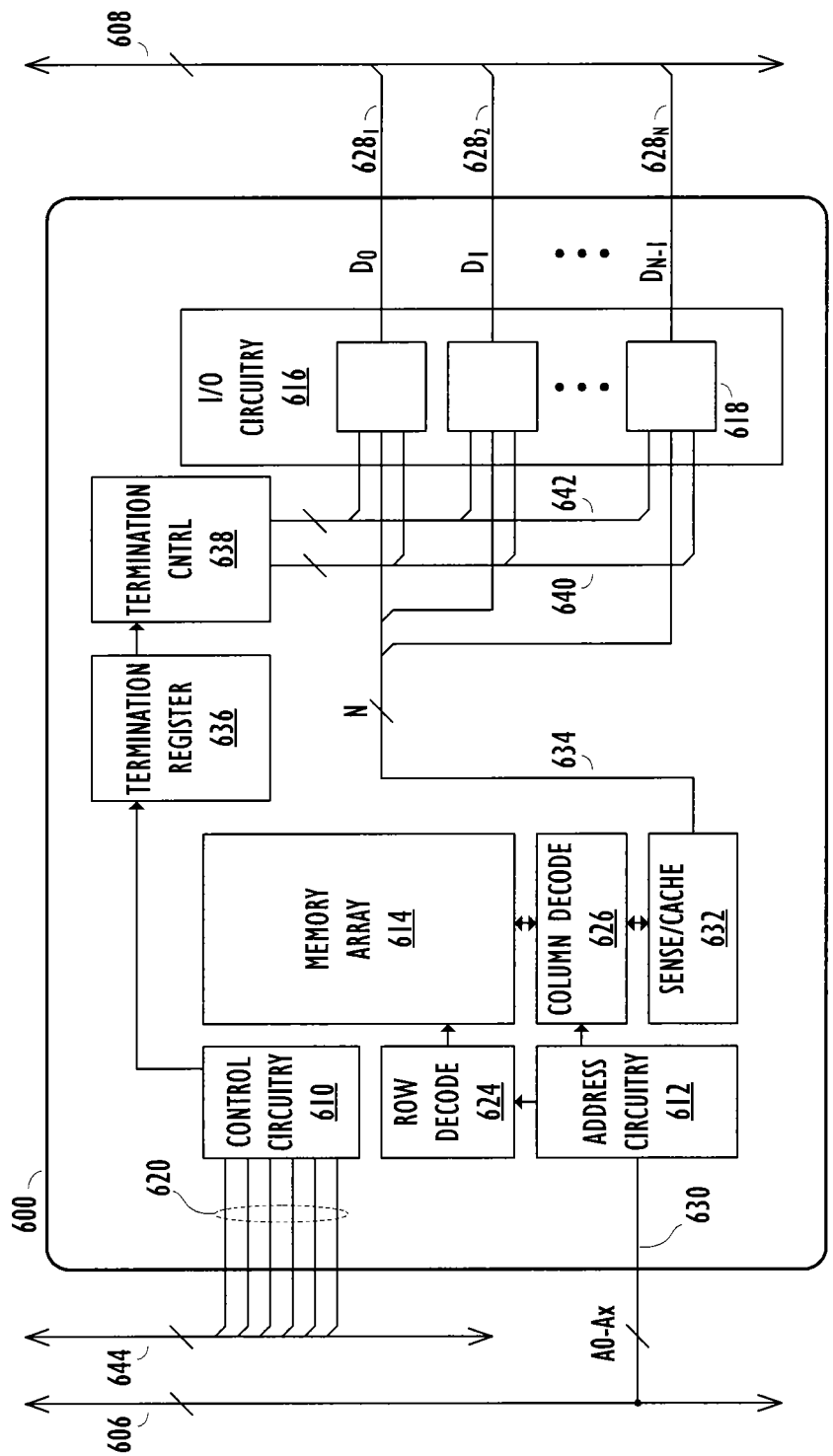
FIG. 6 shows a functional block diagram of a memory device configured to utilize ODT according to an embodiment of the present disclosure.

FIG. 6 illustrates a memory device 600 configured for ODT, such as Memory Devices 310-316 shown in FIG. 3, according to one or more embodiments of the present disclosure. Memory device 600 is shown to be coupled to a plurality of control signals 644, an address bus 606 and a data bus 608 which all might be coupled to a controller (not shown), such as controller 302 shown in FIG. 3, for example. Additional memory devices 600 (not shown) might also be coupled to the control signals 644, address bus 606 and data bus 608, for example.

Memory device 600 comprises one or more arrays of memory cells 614 that might be logically arranged in rows and in columns. According to one or more embodiments of the present disclosure, the memory cells of memory array 614 are non-volatile memory cells (e.g., Flash memory cells). The memory array 614 might also include multiple banks and blocks of memory cells residing on a single or multiple die as part of the memory device 600. Memory array 614 might comprise single level (SLC) and/or multilevel (MLC) memory cells. For example, single level memory cells (SLC) permit the storage of a single binary digit (e.g., bit) of data on each memory cell. Multilevel memory cells assign a data state (e.g., as represented by a bit pattern) to a specific range of threshold voltages (Vt) stored on the memory cell. MLC technology permits the storage of two or more binary digits per cell (e.g., 2, 4, 8, 16 bits), depending on the quantity of threshold voltage ranges assigned to the cell and the stability of the assigned threshold voltage ranges during the lifetime operation of the memory cell.

Address circuitry 612 is provided to latch address signals received on address signal lines A0-Ax 630. The address signals received on signal lines 630 are decoded by a row decoder 624 and a column decoder 626 to access the memory array 614. It will be appreciated by those skilled in the art, with the benefit of the present description, that the number of address input signal lines A0-Ax 630 depends on the density and architecture of the memory array 614. That is, the number of address digits A0-Ax increases with both increased memory cell counts and increased bank and block counts, for example.

The memory device 600 can read data in the memory array 614 by sensing voltage or current changes in the memory array columns using sense devices, such as sense/cache circuitry 632. The sense/cache circuitry 632, according to at least one embodiment, is coupled to read and latch a row of data from the memory array 614.

Data input and output (I/O) circuitry 616 facilitates bi-directional data communication over the plurality of data I/O nodes 628 coupled to the data bus 608. The I/O circuitry 616 comprises a number of output driver circuits 618 according to various embodiments of the present disclosure. Control circuitry 610 is configured to facilitate memory device operations, such as writing data to and/or in erasing data from the memory array 614. Data is transferred between the sense/cache circuitry 632 and the I/O circuitry 616 over signal lines 634, comprising N signal lines, for example.

Memory device 600 further comprises a termination register 636 which is configured to store termination information, such as one or more target addresses. According to one or more embodiments, the termination information might also include termination values (e.g. impedance characteristic to be obtained) associated with the stored target addresses. The termination register 636 may represent volatile or non-volatile storage within the memory device 600. Although not shown in the example of FIG. 6, the termination register 636 may be a portion of the memory array 614. The termination control circuitry 638 is configured to control termination circuitry comprising the output drivers 618 utilizing (e.g., driving), for example, the termination control signal lines 640 and 642. Control circuitry 610 is configured at least in part to facilitate various embodiments of the present disclosure. For example, control circuitry 610 might manage the operation of termination register 636 and the termination control circuitry 638.

Figure 7:
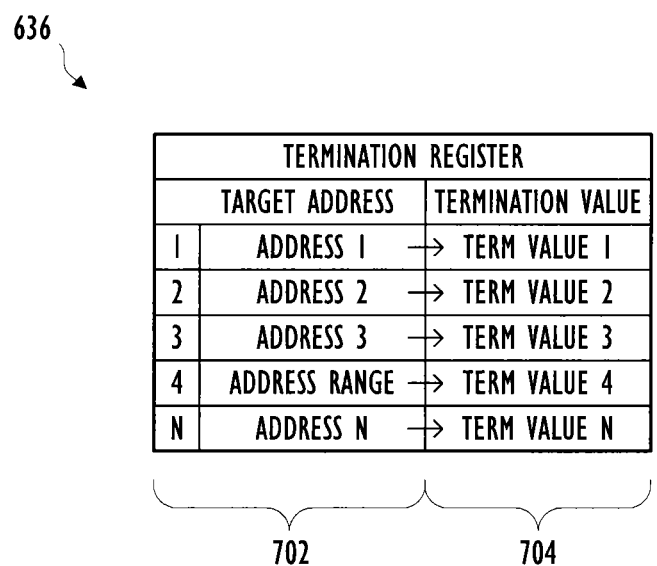
FIG. 7 shows a block diagram representation of a termination register of a memory device according an embodiment of the present disclosure.

Additional detail of an example termination register 636 of FIG. 6 is provided by way of reference to FIG. 7. Termination register 636 may comprise multiple fields for storing termination information (e.g., target addresses and/or termination values) according to various embodiments of the present disclosure. Termination register 636 might be loaded during an initialization operation of the memory device. The target addresses, and termination values if used, might be stored in the memory array 614 to be accessed during the initialization operation to load the termination register 636, for example.

Target address field 702 of termination register 636 stores one or more addresses of memory devices that have been appointed to the particular memory device. For example, if a particular memory device of the memory system is selected (e.g., targeted) for an upcoming memory device operation, memory device 600 will compare the address received on the address bus 606 (e.g., transmitted by the memory system controller) and compare it with target addresses stored in the termination register 636. If the received address matches a target address stored in the termination register 636, memory device 600 recognizes that it is to act as a termination device during the upcoming memory device operation. If the received address does not match a target address stored in the termination register 636, the memory device 600 recognizes that it is not to act as a termination device during the upcoming memory device operation. Although termination register 636 is shown comprising multiple target address register fields 1-N 702 and associated termination value fields (e.g., termination resistance values) 704, the termination register 636 might be comprised of a single target address field 702 and associated termination value field 704. Termination register 636 might also be comprised of only one or more target address fields 702 according to various embodiments of the present disclosure. Termination register 636 might comprise only a single target address field 702, for example.

The address information stored in the target address fields 702 might comprise the actual address of targeted memory devices of the memory system. The target address information might also correspond to one or more targeted memory addresses, such as a value representing a range of addresses, for example. Memory device 600 might be appointed to be a termination device for any targeted memory device in the memory system that is covered by the range of addresses stored in the target address fields 702, for example. It should be noted that a termination register 636 of a particular memory device might contain the address of the particular memory device itself, along with addresses of memory devices different from the particular memory device, for example. Thus, a memory device might act as a termination device to itself and/or a different memory device according to various embodiments of the present disclosure.

Figure 8:
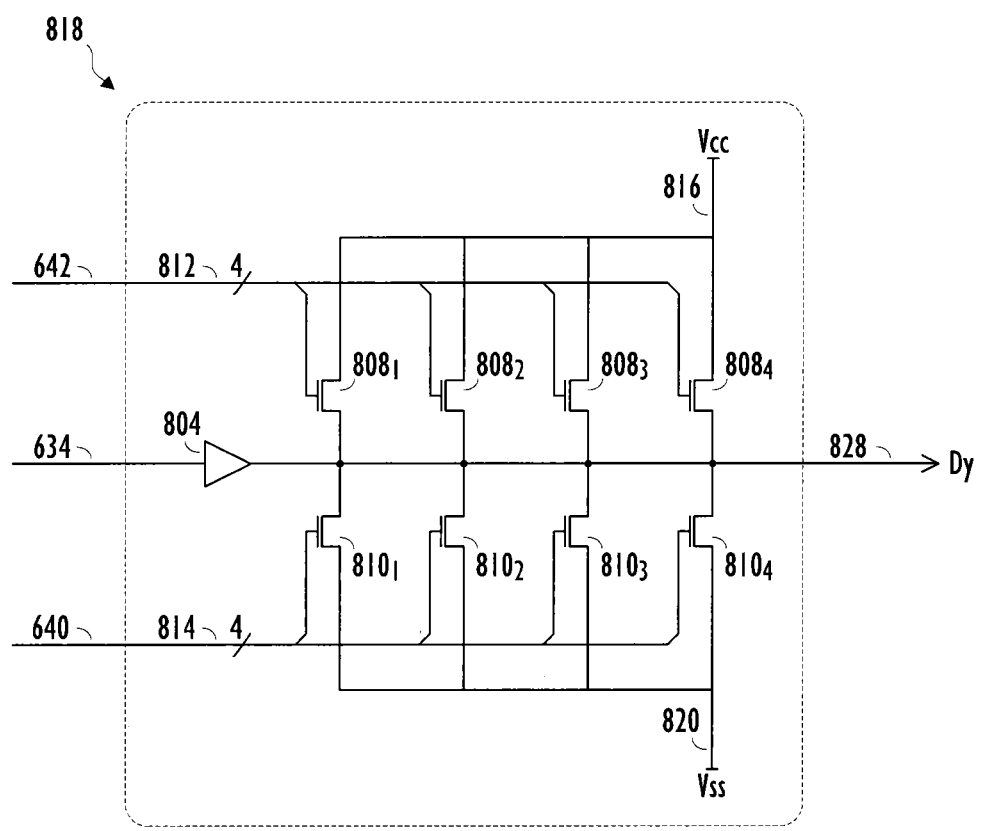
FIG. 8 shows a schematic representation of a driver circuit of a memory device according to an embodiment of the present disclosure.

FIG. 8 shows a more detailed diagram of the termination circuitry comprising one or more of the output drivers 618 of FIG. 6. FIG. 8 illustrates a single output driver circuit 818. Output driver circuit 818 comprises a driver 804 which is configured to drive the data node 828 responsive to a logic level of one of the signal lines 634, such as during a memory device read operation of the memory device 600. The data node 828 might be one of the plurality of data nodes 628 coupled to the data bus 608, for example. Output driver circuit 818 also comprises a plurality of pull-up devices 808, such as the transistors shown coupled between the signal line 828 and a voltage source 816, such as a supply potential Vcc. However, other voltage sources might be coupled to pull-up devices 808, for example. The control gates of each of the pull-up devices 808 may be coupled by signal lines 812 to receive control signals driven on the termination control signal lines 642 by the termination control circuitry 638, for example. Signal lines 812 might comprise four discrete signal lines, one signal line coupled to each control gate of the four pull-up devices 808. Signal lines 812 are shown as a single bus to improve readability of the figure.

Output driver circuit 818 also comprises a plurality of pull-down devices 810, such as the transistors shown coupled between the signal line 828 and a reference source, such as Vss 820, for example. Similar to the pull-up devices 808, the control gates of each of the pull-down devices 810 may be coupled by signal lines 814 to receive control signals driven on the termination control signal lines 640 by the termination control circuitry 638, for example. Signal lines 814 might comprise four discrete signal lines, one signal line coupled to each control gate of the four pull-down devices 810. Signal lines 814 are also shown as a single bus to improve readability of the figure. Although depicted as transistors in FIG. 8, pull-up devices 808 and pull-down devices 810 may include other configurations, such as a switch in series with a resistance.

The output driver circuit 818 configuration shown in FIG. 8 allows for the termination control circuitry 638 to selectively couple any combination of the pull-up devices 808 and/or pull-down devices 810 while the memory device is acting as a termination device. For example, each pull-up device 808 and/or each pull-down device 810 might be configured to exhibit a different termination resistance when activated. This provides additional flexibility in configuring the termination circuitry to adjust the input impedance of the particular data node 828 when the memory device is operating as a termination device. However, transistors 808 and/or transistors 810 might all have the same termination resistance according to various embodiments of the present disclosure.

As discussed above, a memory device according to one or more embodiments of the present disclosure might act as a termination device for itself. A particular configuration of pull-up devices 808 and/or pull-down devices 810 might be activated while the driver 804 drives the signal line 828 responsive to a logic level of one of the signal lines 634, for example.

It should be noted that the various embodiments are not limited to four pull-up devices 808 and/or four pull-down devices 810 as are shown in FIG. 8. Additional embodiments might comprise more or less pull-up and/or pull-down devices. For example, signal lines 812, 814 might each comprise six signal lines to facilitate individual selection (e.g., activation) of termination devices in an embodiment incorporating six pull-up and six pull-down components in the termination circuitry, for example. According to one or more embodiments of the present disclosure, individual lines of signal lines 812, 814 might be coupled to multiple control gates of their respective pull-up 808 and/or pull-down 810 devices. For example, the control gates of pull-up devices $808_{1,2}$ might be coupled to a single line of signal lines 812 and the control gates of pull-down devices $810_{1,2}$ might be coupled to a single line of signal lines 814.

As discussed above various embodiments according to the present disclosure might store a termination value along with a stored target address in a memory device configured to operate as a termination device. According to one or more of the embodiments, the termination control circuitry 638 might also selectively adjust the termination circuitry (e.g., activate one or more pull-up devices 808 and/or pull-down devices 810) in the output drivers 818 in response to a stored termination value associated with a particular stored target address. According to various embodiments of the present disclosure, the termination value may be directly indicative of a particular impedance characteristic. According to one or more embodiments, the termination value might be a value indicative of an activation pattern of the pull-up devices 808 and pull-down devices 810 to obtain the particular impedance characteristic of signal line 828.

Figure 9:
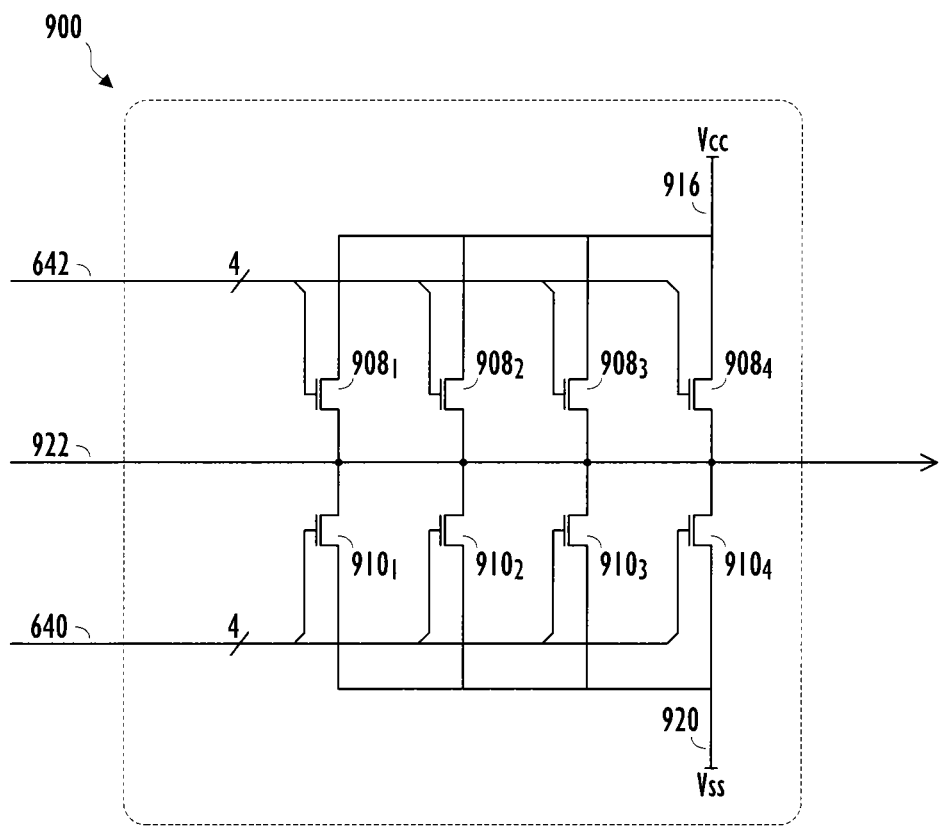
FIG. 9 shows a schematic representation of a driver circuit of a memory device according to an embodiment of the present disclosure.

FIG. 9 illustrates additional termination circuitry 900 according to various embodiments of the present disclosure. The termination circuit 900 of FIG. 9 provides termination for additional signal lines coupled to a memory device. Node 922 might comprise one of the control signal nodes 620 shown in FIG. 6, for example. Termination circuitry 900 might be provided to selectively adjust the impedance seen by one or more of a clock signal, data strobe signal, and/or other control signals coupled to the memory device 600, for example.

The individual termination devices of termination circuitry 900, such as pull-up devices 908 and pull-down devices 910, might be controlled by the same control signals 640, 642 as discussed with respect to activating the pull-up devices 808 and pull-down devices 810 shown in FIG. 8. Each of the pull-up devices 908 and pull-down devices 910 might have the same, or might have different on resistances, such as discussed above with respect to FIG. 8. The termination devices 908, 910 of FIG. 9 are shown coupled between a voltage source 916 (e.g., Vcc) and a reference source (e.g., Vss) 920, for example.

Termination circuitry 900 shown in FIG. 9 might be activated along with the termination circuitry discussed with respect to FIG. 8, such as during a memory device operation, for example. The termination register 636 discussed with respect to FIG. 7 might also comprise additional data fields (not shown.) The additional data fields might indicate for which stored addresses the memory device is to activate the termination circuitry of FIG. 9 and, according to at least one embodiment, what termination resistance value the circuitry of FIG. 9 is to be configured to apply to node 922, for example. Thus, according to one or more embodiments, the termination circuitry 900 of FIG. 9 might be configured in response to a particular stored termination resistance value and/or might be configured to the same termination resistance value as the termination circuitry of FIG. 8, for example.

CONCLUSION

In summary, one or more embodiments of the present disclosure provide methods of selecting one or more memory devices to facilitate selective signal line termination for signal lines coupled to one or more memory devices. Thus, various embodiments according to the present disclosure facilitate, for example, adjustment of the input impedance of one or more input and/or output data nodes of a particular memory device, for example.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method comprising:
   receiving an address at each of a plurality of memory devices; and
   selecting termination circuitry in at least two of the memory devices responsive to the received address matching a target address stored in the least two of the memory devices;
   wherein the target address is an address of a memory device that is different than the at least two memory devices and that is selected for a memory device operation.

2. The method of claim 1, wherein each of the memory devices comprises a single die.

3. The method of claim 1, wherein selecting termination circuitry comprises activating termination circuitry.

4. The method of claim 3, wherein the termination circuitry is activated responsive to the received address matching the target address stored in the least two of the memory devices.

5. A method comprising:
   receiving an address at each of a plurality of memory devices, wherein each of the memory devices comprises a plurality of die; and
   selecting termination circuitry in at least two of the die of at least one of the memory devices responsive to the received address matching a target address stored in the at least one of the memory devices;
   wherein the target address corresponds to a die that is different than the at least two die of the at least one of the memory devices and that is selected for a memory device operation.

6. The method of claim 5, wherein the plurality of memory devices comprise two memory devices and wherein selecting termination circuitry comprises activating termination circuitry in at least two of the die of only one of the memory devices.

7. The method of claim 5, wherein the at least two of the die of the at least one of the memory devices store the target address, and wherein the termination circuitry in the at least two of the die of the at least one of the memory devices is selected responsive to the received address matching the target address stored in the at least two of the die of the at least one of the memory devices.

8. A method of operating a memory device, the method comprising:
   adjusting an impedance characteristic of the memory device responsive to the memory device receiving a particular address that matches an address stored in the memory device;
   wherein the address stored in the memory device corresponds to a different memory device.

9. The method of claim 8, wherein adjusting an impedance characteristic further comprises adjusting an impedance characteristic of a data node of the memory device.

10. The method of claim 9, wherein adjusting an impedance characteristic of a data node further comprises adjusting the impedance characteristic where the data node comprises a terminal of an interface of the memory device.

11. The method of claim 8, wherein adjusting an impedance characteristic further comprises adjusting an impedance characteristic of a control signal node of the memory device.

12. The method of claim 11, wherein adjusting an impedance characteristic of a control signal node further comprises adjusting the impedance characteristic where the control signal node comprises a terminal of an interface of the memory device.

13. The method of claim 8, wherein the address stored in the memory device is appointed by a controller external to the memory device during an initialization operation of the memory device.

14. The method of claim 8, wherein the address stored in the memory device is included in a range of addresses, and further comprising storing the range of addresses.

15. A method of operating a plurality of memory devices commonly coupled by an address bus and a data bus, the method comprising:
   selecting termination circuitry in a first memory device and in a second memory device responsive to the first memory device and the second memory device receiving an address that matches a target address stored in the first memory device and in the second memory device, wherein the target address is an address of a third memory device selected for a memory device operation;
   wherein the termination circuitry in the first memory device and in the second memory device are configured to adjust an impedance characteristic of one or more data nodes of the first memory device and of the second memory device, respectively, that are coupled to the data bus.

16. The method of claim 15, wherein a memory device operation is one of a programming operation and a read operation.

17. A method of operating a plurality of memory devices commonly coupled by an address bus and a data bus, the method comprising:
   selecting termination circuitry in a first memory device responsive to the first memory device receiving an indication that a second memory device is selected for a memory device operation; and
   selecting termination circuitry in the second memory device responsive to the second memory device receiving an indication that a third memory device is selected for a memory device operation;
   wherein the termination circuitry in the first memory device is configured to adjust an impedance characteristic of one or more data nodes of the first memory device that are coupled to the data bus;
   wherein the termination circuitry in the second memory device is configured to adjust an impedance characteristic of one or more data nodes of the second memory device that are coupled to the data bus.

18. The method of claim 17, further comprising:
   selecting the termination circuitry in the first memory device and in the second memory devices responsive to the first and the second memory devices receiving an indication that a third memory device is selected for a memory device operation.

19. The method of claim 18, wherein selecting termination circuitry in the first and the second memory devices further comprises selecting termination circuitry in the first and the second memory devices where the termination circuitry in the first and the second memory devices are configured to adjust the impedance characteristic of the respective one or more data nodes of the first and the second memory devices by the same amount.

20. The method of claim 18, wherein selecting termination circuitry in the first and the second memory devices further comprises selecting termination circuitry in the first and the second memory devices where the termination circuitry in the first and the second memory devices are configured to adjust the impedance characteristic of the respective one or more data nodes of the first and the second memory devices by a different amount.

21. A method of operating a memory system, the method comprising:
   selecting a termination circuit in a memory device selected as a termination device responsive to the termination device receiving an address that matches a target address stored in the termination device;
   wherein the target address is an address of a different memory device of the memory system selected for a memory device operation; and
   wherein the termination circuit is configured to selectively adjust an impedance characteristic of one or more nodes of the termination device.

22. The method of claim 21, wherein a termination value is stored in the termination device, and wherein the termination value is associated with the stored target address.

23. The method of claim 22, wherein selecting the termination circuit in the termination device further comprises activating the termination circuit to adjust the impedance of the one or more of the nodes responsive to the stored termination value corresponding to the stored target address.

24. The method of claim 21, wherein the target address stored in the termination device is a first target address stored in the termination device, and wherein a second target address is stored in the termination device.

25. The method of claim 24, further comprising selecting the termination circuit in the termination device responsive to the termination device receiving an address that matches the second target address.

26. A memory device, comprising:
   an array of memory cells;
   an interface; and
   a first termination circuit, wherein the first termination circuit is configured to adjust an impedance characteristic of the interface responsive to the interface receiving an address that matches a first target address stored in the memory device;
   wherein the first target address corresponds to a different memory device.

27. The memory device of claim 26, further comprising a second termination circuit, wherein the second termination circuit is configured to adjust an impedance characteristic of the interface responsive to the interface receiving an address that matches a second target address stored in the memory device.

28. The memory device of claim 27, wherein the first termination circuit and the second termination circuit are configured to adjust an impedance characteristic of their respective interfaces by the same amount.

29. The memory device of claim 27, wherein the first termination circuit and the second termination circuit are configured to adjust an impedance characteristic of their respective interfaces by a different adjusted amount.

30. The memory device of claim 27, wherein the first target address and the second target address are the same address.

31. The memory device of claim 27, wherein the first target address and the second target address are different addresses.

* * * * *